(12) United States Patent
Matsushita et al.

(10) Patent No.: US 8,426,302 B2
(45) Date of Patent: Apr. 23, 2013

(54) METHOD OF MANUFACTURING SEMICONDUCTOR DEVICE

(75) Inventors: Daisuke Matsushita, Hiratsuka (JP); Koichi Kato, Yokohama (JP); Yuichiro Mitani, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/370,532

(22) Filed: Feb. 10, 2012

(65) Prior Publication Data

US 2012/0142180 A1 Jun. 7, 2012

Related U.S. Application Data

(63) Continuation of application No. PCT/JP2009/066284, filed on Sep. 17, 2009.

(51) Int. Cl.
*H01L 21/3205* (2006.01)
*H01L 21/4763* (2006.01)

(52) U.S. Cl.
USPC ...... 438/591; 438/264; 438/791; 257/E21.21; 257/E21.192; 257/E29.309

(58) Field of Classification Search .................. 438/151, 438/240, 591; 257/66, 324, 326, E21.009, 257/E21.011
See application file for complete search history.

(56) References Cited

U.S. PATENT DOCUMENTS

| 2002/0125480 A1* | 9/2002 | Nakamura et al. ............... 257/66 |
| 2004/0097033 A1* | 5/2004 | Chung et al. ................... 438/240 |
| 2006/0051903 A1 | 3/2006 | Kunii |
| 2008/0182368 A1 | 7/2008 | Kunii |
| 2009/0146206 A1 | 6/2009 | Fukuzumi et al. |
| 2010/0019312 A1* | 1/2010 | Sekine et al. ................. 257/326 |

FOREIGN PATENT DOCUMENTS

| JP | 2003-188182 | 7/2003 |
| JP | 2006-49535 | 2/2006 |
| JP | 2007-242819 | 9/2007 |
| JP | 2007-266143 | 10/2007 |
| JP | 2008-187077 | 8/2008 |
| JP | 2009-135324 | 6/2009 |

OTHER PUBLICATIONS

International Preliminary Report on Patentability and Written Opinion issued by the International Bureau of WIPO on Apr. 11, 2012, for International Application No. PCT/JP2009/066284.
International Search Report from Japanese Patent Office for International Application No. PCT/JP2009/066284, Mailed Dec. 1, 2009.

* cited by examiner

*Primary Examiner* — Charles Garber
*Assistant Examiner* — Abdulfattah Mustapha
(74) *Attorney, Agent, or Firm* — Finnegan, Henderson, Farabow, Garrett & Dunner, L.L.P.

(57) ABSTRACT

A method of manufacturing a semiconductor device according to an embodiment, includes: forming a stack structure by alternately stacking control gate electrodes and interlayer insulating films; forming a through-hole that penetrates through the stack structure in a stacking direction of the control gate electrodes and the interlayer insulating films; forming a first insulating film that covers an inner surface of the through-hole; forming a charge storage layer that covers an inner surface of the first insulating film; forming a second insulating film that covers an inner surface of the charge storage layer; forming a semiconductor layer that covers an inner surface of the second insulating film; and oxidizing an interface between the semiconductor layer and the second insulating film by performing a heat treatment in an atmosphere containing $O_2$ gas at a temperature of 600° C. or lower.

11 Claims, 15 Drawing Sheets

Weakly binding interface state

RATE OF GENERATION OF INTERSTITIAL SILICON ATOMS  1-2%

→Weakly binding interface state $P_b$ CENTERS

PROBABILITY OF CONTINUOUS OR ALTERNATE GENERATION
$10^{-2} \times 10^{-2} = 10^{-4}$
→$P_b$ CENTERS (a)

(b)

METHOD OF MANUFACTURING SEMICONDUCTOR DEVICE

This application is a continuation of international application no. PCT/JP2009/066284 filed on Sep. 17, 2009 in Japan, the entire contents of which are incorporated herein by reference.

FIELD

Embodiments described herein relate generally to a method of manufacturing a semiconductor device.

BACKGROUND

For semiconductor devices, the technique for controlling the interface between an insulating film and a semiconductor is critically important. In a case where the insulating film is a tunnel insulating film used in a flash memory, the insulating film serves not only to control the conduction of carriers flowing in the semiconductor but also to control exchanges of electrons between a charge storage film and the semiconductor layer.

As the method of forming the tunnel insulating film on the semiconductor layer, a process to form an insulating film through deposition at 800 to 900° C. or lower by CVD (Chemical Vapor Deposition), HTO (High Temperature Oxide), ALD (Atomic Layer Deposition), or the like is becoming commoner than a so-called thermal oxidation process to expose the surface of the semiconductor layer to an oxygen molecular gas at atmospheric pressure and at a high temperature of 900° C. or higher. This is because the structure of each flash memory is changing from a conventional flat-type structure to a three-dimensional structure, and the distances and volumes between devices are becoming shorter and smaller as miniaturization progresses. In such a trend, changes in volume at the time of high-temperature treatment cannot be absorbed by devices, and the manufacturing process needs to be a low-temperature process with low stress.

A three-dimensional structure also differs from a flat-type structure in that the semiconductor layer is deposited after the tunnel insulating film is deposited. For example, JP-A 2007-266143(KOKAI) discloses a technique by which a NAND string is perpendicular to an in-plane direction, not parallel to an in-plane direction as in conventional cases so that the control gate electrode is formed first, and the channel Si layer is formed lastly. However, since the formation temperatures of a depositional insulating film and a semiconductor layer, or of a depositional insulating film and a depositional semiconductor layer, are low, the interface state density is high. Therefore, the mobility and the reliability are lower than those of conventional structures subjected to high-temperature treatments, and the characteristics easily vary. This leads to degradation of write and erase characteristics, and to difficulties in performing multi-valued processing due to increases in threshold value variations.

The depositional semiconductor layer and the depositional insulating film are used in Thin Film Transistors (TFTs) for liquid crystal displays, and the channel layer is formed by depositing amorphous silicon or polysilicon on an insulating film such as a glass substrate. In that case, however, the mobility is low as in the above described cases. Therefore, instabilities stem from the facts that it is difficult to form high-speed circuits, and the threshold voltage varies with the elapsed time, the gate voltage, and the temperature. In that case, it is also necessary to increase the mobility and reliability.

A large number of defects such as Si dangling bonds exist at the interface between a Si layer and an insulating film (such as a $SiO_2$ film) formed on the Si layer. Those defects form interface states. In a MOSFET (Metal-Oxide-Silicon Field Effect Transistor) that is a typical structure of, for example, a switching device, those defects result in decreases in mobility and reliability, and the switching characteristics are degraded. To solve this problem by a conventional technique, a MOS structure is subjected to a heat treatment in a hydrogen atmosphere, and the Si dangling bonds are inactivated through hydrogen termination or formation of Si—H bonds.

In recent years, however, it has become clear that the hydrogen termination has a problem. Specifically, the Si—H bonds form a large dipole, and cause carrier scattering. In a flash memory, hydrogen is detached from the Si—H bonds under stress of an electric field, and the program voltage Vgm is varied. Therefore, in a stack structure including a $SiO_2$ film and a Si layer having a large number of interface states, a termination technique that replaces the hydrogen termination is required. Particularly, as for the tunneling films that are components of nonvolatile memories, the oxidation temperature for CVD (Chemical Vapor Deposition) or the like is becoming lower to cope with three-dimensional structures, and the interface state density prior to hydrogen termination is ever increasing. Therefore, higher voltages are generally used to lower the mobility and increase the on-state current Ion. The higher voltages reduce the reliability of each device and hinder multi-valued operations.

DETAILED DESCRIPTION

Figure 1:
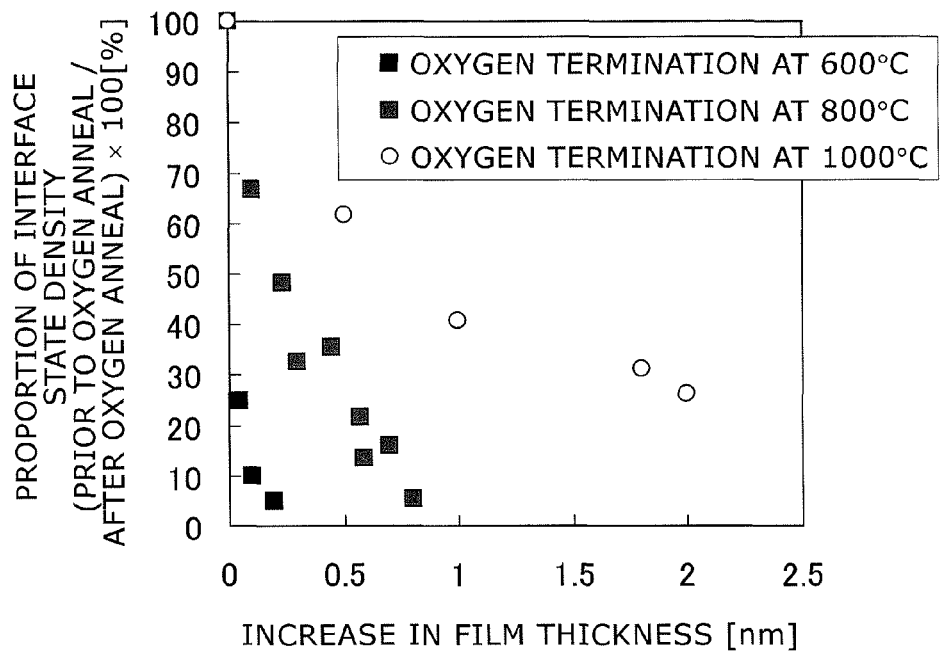
FIG. 1 is a graph showing the relationship between the interface state density and the increase in film thickness where the oxygen termination temperature is varied.

A method of manufacturing a semiconductor device according to an embodiment, includes: forming a stack structure by alternately stacking control gate electrodes and interlayer insulating films; forming a through-hole that penetrates through the stack structure in a stacking direction of the control gate electrodes and the interlayer insulating films; forming a first insulating film that covers an inner surface of the through-hole; forming a charge storage layer that covers an inner surface of the first insulating film; forming a second insulating film that covers an inner surface of the charge storage layer; forming a semiconductor layer that covers an inner surface of the second insulating film; and oxidizing an interface between the semiconductor layer and the second insulating film by performing a heat treatment in an atmosphere containing $O_2$ gas at a temperature of 600° C. or lower.

(Outline of Embodiments)

Outline of the embodiments is described before respective embodiments are explained.

First, to reduce the interface state density at the interface between an insulating film and a semiconductor layer (a silicon layer), the inventors considered oxygen termination, instead of hydrogen termination, and conducted an experiment. This experiment was conducted as follows.

A Si substrate having a (100) plane as the principal surface is subjected to a diluted hydrofluoric acid treatment, to form a structure having the Si substrate terminated by hydrogen. The hydrogen-terminated Si substrate is put into an atmosphere containing only a nitrogen gas, and the substrate temperature is increased to 600° C., so that hydrogen is completely detached from the Si substrate.

After that, the atmosphere in the chamber is filled only with an $O_2$ gas at 760 Torr, and the surface temperature of the silicon substrate is set to 950° C., for example. The surface temperature is maintained for two minutes and thirty seconds. As a result of this, an oxide film of 2.5 nm in film thickness is formed on the silicon substrate. At this point, interface states remain between the silicon substrate and the oxide film.

After that, to terminate the interface between the silicon substrate and the oxide film with oxygen, the atmosphere in the chamber is changed to an oxidizing gas atmosphere containing $O_2$ ($N_2$=60 L/min, $O_2$=0.12 L/min) at 740 Torr in total pressure and at 14 Torr in partial pressure, and the heater is controlled so that the temperature of the silicon substrate having the oxide film formed thereon is set to 600° C. or lower. The temperature is maintained for 30 minutes or longer. As a result, the introduced oxygen atoms diffuse in the vicinity of the interface, and terminate the interface states. In this manner, the most stable structure in terms of energy is formed.

A polysilicon film of 150 nm in film thickness, for example, is then deposited on the structure. P is implanted by a dose amount of $4 \times 10^{15}$ $cm^{-2}$ at an acceleration voltage of 4 keV, and spike annealing is performed at 1050° C., to activate the phosphorus in the polysilicon film. As a result of this, a polysilicon electrode is formed on the oxide film.

In the above described experiment, the relationship between the heat treatment time and the interface state density at the time of hydrogen termination was examined. The examination results showed that, although the effect was observed after 30 minutes, the interface state density became much lower after a 60-minutes or longer treatment, and, after 12 hours, the interface state density decreased to almost the same amount as that obtained through the generally-used hydrogen termination process or almost disappeared. The increase in the film thickness of the oxide film at this point was approximately 0.2 nm, and a $SiO_2$ film equivalent to almost one layer was formed. As the oxidation of one layer was performed, the interface state density became lower, for the following possible reasons: oxygen reached the portions between the interface states and spontaneously terminated the interface states; there was only a low probability that the oxygen would enter Si—Si bonds and cause oxidation, because the temperature was as low as 600° C.; and the oxygen did not frequently crack the Si—Si bonds, because the oxygen pressure was low, and the amount of oxygen that reached the Si—Si bonds per unit time was small. For the above reasons, the following specific phenomena that accompany oxidation can be restrained.

The next oxidation does not start immediately after oxidation of one layer is completed. Oxidation and oxygen termination are in a competitive relationship with each other, and oxidation of the next layer starts before oxidation of a first layer is completed. This can be explained by the differences in amount of energy gained through oxidation. Therefore, where the oxidation temperature is high while the oxygen supply rate is high, oxygen easily diffuses, and the oxidation of the next layer is likely to start before the oxidation of the first layer is completed, resulting in more defects. That is, those defects facilitate oxidation, and accordingly, oxidation at high pressure and temperature has a high oxidation rate. Where the oxidation temperature is low while the oxygen supply rate is low, on the other hand, oxygen does not easily diffuse, and the oxidation rate becomes lower. As a result, oxidation of the next layer does not readily start, and oxidation preferentially occurs at defective portions.

It has also become apparent from the above described experiment that the film thickness of the insulating film becomes greater due to the heat treatment temperature at the time of oxygen termination. In view of this, an experiment was conducted to examine the relationship between the increase in the film thickness of the insulating film and the interface state density where the heat treatment temperature at the time of oxygen termination was varied. The results of the experiment are shown in FIG. 1.

FIG. 1 is a graph showing the relationship between the increase in the film thickness of the insulating film and the interface state density where the heat treatment temperature was varied from 600° C. to 800° C. to 1000° C. The ordinate axis indicates the proportion (%) of the interface state density to the interface state density (represented by the value of 100) observed prior to oxygen termination. As can be seen from FIG. 1, as the heat treatment temperature is lowered from 1000° C. to 800° C. to 600° C., the amount of change in the interface state density with respect to the change in the film thickness of the insulating film becomes larger. Particularly, at 600° C., the amount of change in the interface state density is large. This is because, at 600° C., oxygen termination was apparently performed only at defective portions. The results indicate that an interface oxidation process at a high temperature (in the neighborhood of 1000° C., for example) is not suited to reduce the interface state density while controlling the film thickness. Therefore, oxygen termination is preferably performed at 600° C. or lower.

Even if the temperature at the time of oxygen termination is 600° C. or lower, the increase in the film thickness is preferably restrained to 0.3 nm or smaller, for the following reasons. Although oxidation of the next layer starts when one layer is completely oxidized, the location at which new interface states are generated at this point is approximately 0.3 nm lower than the interface between the $SiO_2$ film and the Si layer, as described above. Also, after the oxidation amount reaches 0.3 nm or larger, the interface state density again becomes higher. The interface is oxidized at 600° C. or lower for 12 hours or less, and the increase in film thickness is restrained to 0.3 nm or smaller. In this manner, the interface states are terminated by oxygen, and the oxidation is stopped when the layer containing the interface states is completely oxidized. If the oxidation is continued longer than that, oxidation of the next layer, that is, interface state generation and oxidation occurs, and as a result, the interface state density again starts increasing.

Figure 2:
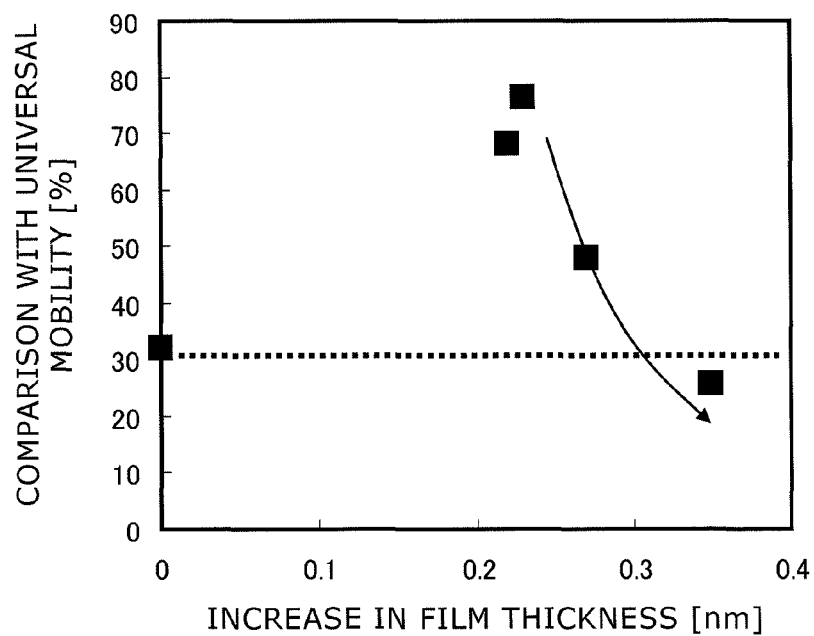
FIG. 2 is a graph showing the relationship between the mobility and the increase in film thickness.

FIG. 2 shows the relationship between the amount of oxidation at the interface (the increase in the film thickness of the oxide film) and the universal mobility in a case where the interface between the $SiO_2$ film and the Si layer was oxidized at 600° C., with the interface state density being $8 \times 10^{11}$ $cm^{-2}$. As can be seen from FIG. 2, the mobility continued to become higher until the oxidation amount reached 0.25 nm. However, the mobility became lower after the oxidation amount became larger than 0.3 nm. This is supposedly because the interface state density increased when the oxidation of the next layer started.

Figure 3:
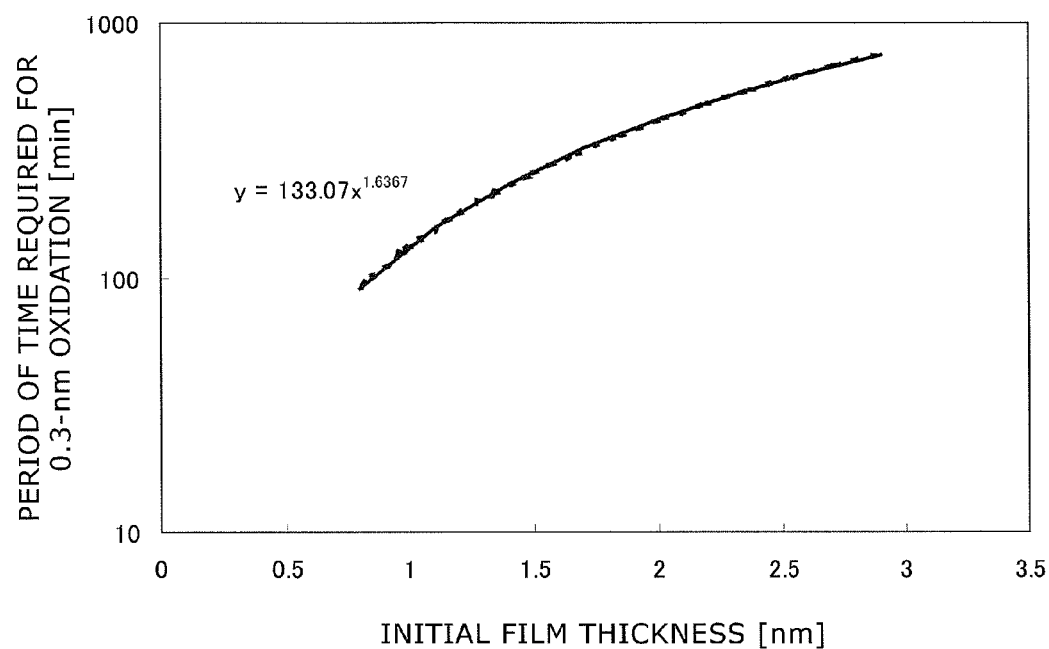
FIG. 3 is a graph showing the relationship between the film thickness of an oxide film and the period of time required for the increase in film thickness to reach 0.3 nm by an oxidation process.

To restrain the oxidation amount to 0.3 nm or smaller to reduce the interface states, the effective oxidation time is approximately 30 minutes to 12 hours in a case where the film thickness of the oxide film is 2.5 nm. However, if the film thickness is smaller than that, the required oxidation time becomes shorter. This is because, when the film thickness becomes smaller, the amount of oxygen reaching the interface becomes larger, and the oxidation rate becomes faster. FIG. 3 shows the period of time required to restrain the increase in film thickness caused by oxidation to 0.3 nm where the initial film thickness is varied. As long as the oxidation time is within the period of time shown in FIG. 3 in the case of each film thickness, the increase in film thickness can be restrained to 0.3 nm or smaller, and the interfacial characteristics can be improved by terminating the interface states with oxygen.

Figure 4:
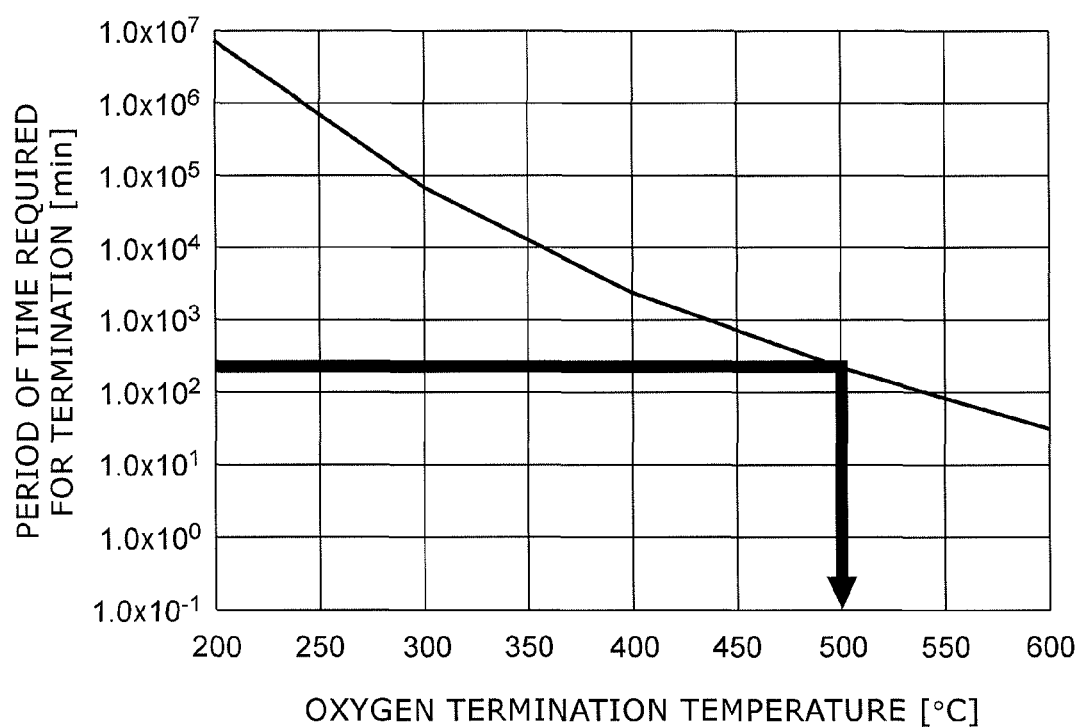
FIG. 4 is a graph showing the oxygen temperature dependence of the period of time required for oxygen termination.

Although the oxidation time at 600° C. is typically 30 minutes or longer, the oxidation time can be shorter than that, as long as the interface is terminated by oxygen. Also, if allowable in the process, oxidation can be performed for two hours or longer. However, a long processing time lowers the throughput of products and therefore, is not preferable. Even if the processing in the furnace is collectively performed, 2-hour or shorter processing is ideal. Also, as long as the interface is oxidized, the temperature can be lower than 600° C. However, the oxygen diffusion rate in Si becomes much lower with a decrease in temperature, and as a result, the processing time becomes longer. FIG. 4 shows the relationship between the oxygen termination temperature and the period of time required for oxygen to diffuse in a 10-nm thick Si layer and sufficiently terminate the interface between the $SiO_2$ film and the Si layer with oxygen. As can be seen from FIG. 4, where the processing time is two hours or shorter, the temperature needs to be 500° C. or higher. To achieve an effect at a temperature lower than that, a very long period of time is required, which is unrealistic where throughput is taken into account.

From the above experiment results, to restrain increases in the interface state density between the semiconductor layer and the insulating film, it is critical to introduce $O_2$ into the insulating film formed on the semiconductor layer at 600° C. or lower, diffuse the $O_2$ into the interface between the semiconductor layer and the insulating film, and oxidize the semiconductor layer by 0.3 nm or less. That is, it is critical to "terminate the interface states with oxygen, and stop the oxidation when only the layer containing the interface states is oxidized." To realize this, in an embodiment of the present invention, the interface between the $SiO_2$ film and the Si layer is oxidized at a low temperature of 600° C. or an even lower temperature. Since oxidation is extremely slow at 600° C., oxidation of the interface states that are instable in terms of energy can be preferentially and selectively performed, compared with oxidation of Si—Si bonds that are stable in terms of energy.

Figure 5:
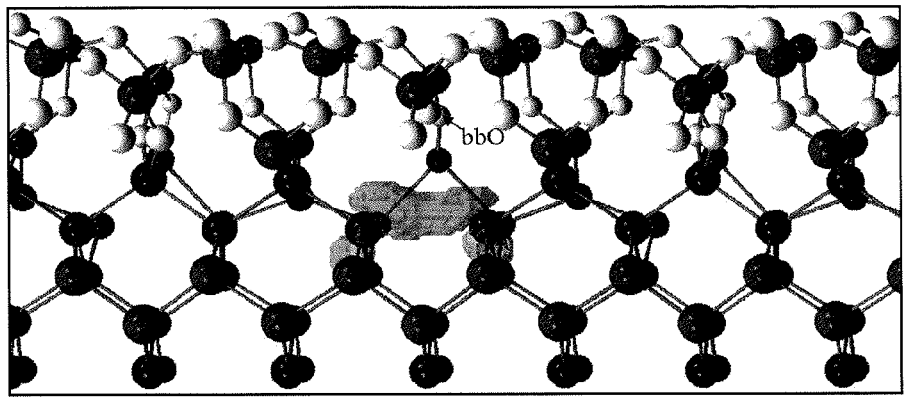
FIG. 5 shows a model of WBs at the interface between a silicon layer and an insulating film.
Figure 6:
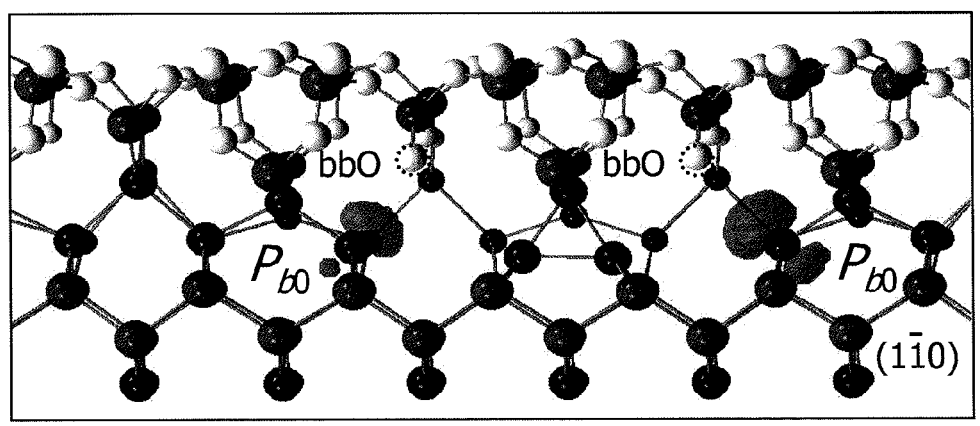
FIG. 6 shows a model of Pb centers at the interface between the silicon layer and the insulating film.
Figure 7:
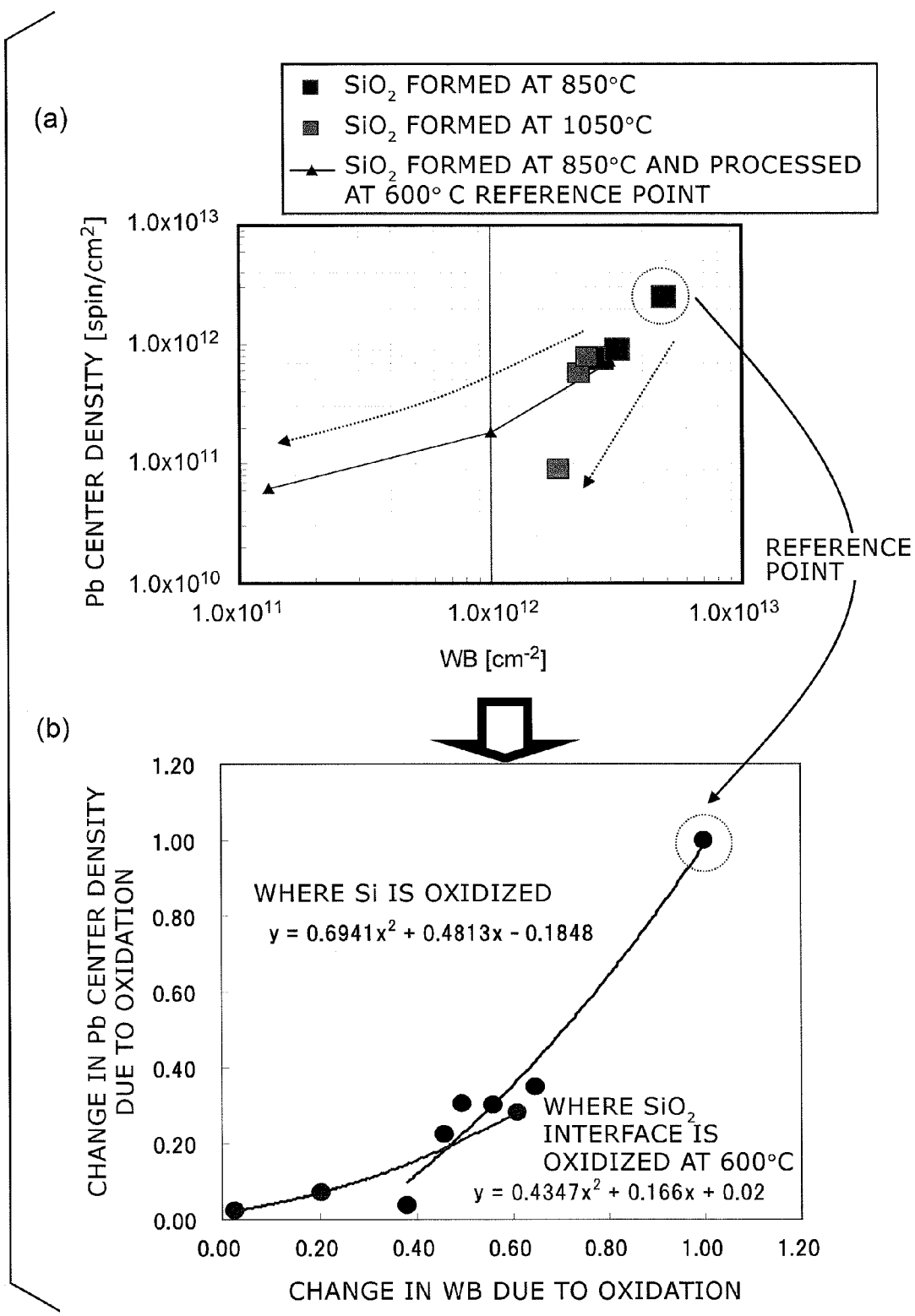
FIG. 7(a) is a graph showing the WB dependence of the Pb centers.
FIG. 7(b) is a graph showing the WB dependence of the Pb centers formed by oxidation.

FIGS. 5 through 7(b) show the results of verification performed on selective oxidation at 600° C. As described above, when oxygen is introduced into Si—Si bonds existing in the vicinity of the interface, interface states are formed as the oxidation progresses. The interface states exist at a depth of 0.3 nm or less, facing one another (FIG. 5). In the interface states, there exist weakly binding interface states (hereinafter referred to as WBs) each formed by removing a Si atom, and Pb centers that are secondarily generated as the WBs are continuously or alternately formed (FIG. 6). There is a square relationship between the WBs and the Pb centers. However, in the WBs, Si dangling bonds exist next to one another. Therefore, when $O_2$ reaches the WBs, the WBs more easily dissociate and adsorb the $O_2$, compared with the Pb centers.

Changes that were caused in the WBs and the Pb centers when the interface was oxidized at 600° C. by utilizing the above features were observed. FIG. 7(a) shows the absolute values of the Pb center density and WBs under various oxidizing conditions. FIG. 7(b) shows the relative values of the Pb center density and the WBs before and after oxidation. When the relative values shown in FIG. 7(b) were calculated, the uppermost point on the right-hand side in FIG. 7(a), which represents the film that is formed at 850° C. and has the largest number of interface states, was used as the reference (denominator), and the points on the left side were used as numerators. First, the relationship indicated by the line on the right-hand side in FIG. 7(b) is described. Where Si is oxidized with $O_2$, there is a uniform relationship between the WBs and the Pb centers, regardless of oxidizing conditions. This is because the temperature is high, and a sufficient amount of heat is provided to introduce oxygen into the Si—Si bonds and allow oxidation of the Si—Si bonds. The relationship indicated by the line on the left-hand side in FIG. 7(b) is now described. Where a stack structure formed with the $SiO_2$ film and the Si layer in the above manner is oxidized at 600° C., the relationship between the WBs and the Pb centers becomes unbalanced. That is, where oxidation is performed at 600° C., the change in the WBs with respect to the change in the Pb center density is larger than that in a case where Si is oxidized. The relationship between the WBs and the Pb centers secondarily generated by continuously forming the WBs is unbalanced, and the number of WBs preferentially becomes smaller. This indicates that the temperature is as low as 600° C., and the amount of heat required for breaking the Si—Si bonds is not provided. Therefore, Si dangling bonds are preferentially oxidized. That is, the WBs adjacent to Si dangling bonds are preferentially oxidized. As described above, at 600° C., selective oxidation of the dangling bonds at the interface between the $SiO_2$ film and the Si layer can be performed, and the interface state density can be lowered while the increase in film thickness is restrained.

Figure 8:
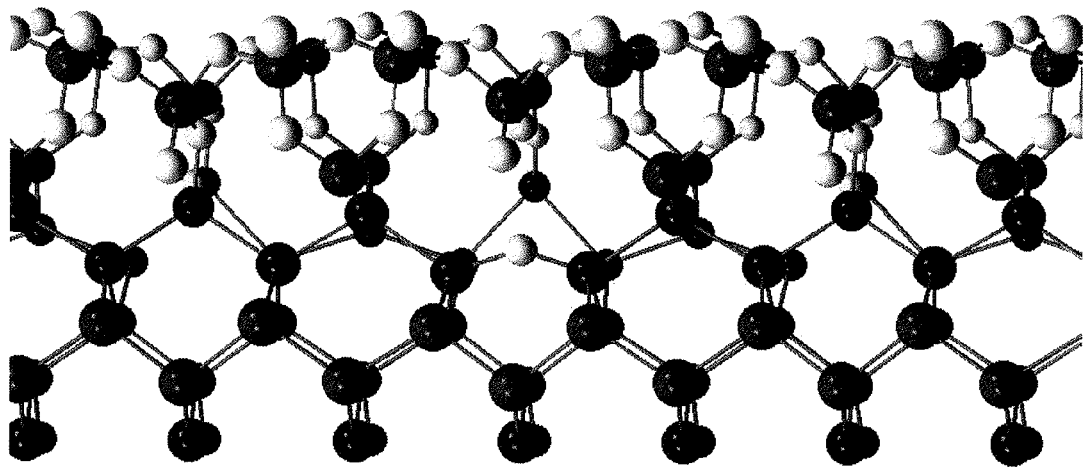
FIG. 8 shows a model of the interface between the silicon layer and the insulating film.

FIG. 8 shows a model of an area in the vicinity of the interface. As can be seen from FIG. 8, the interface states between the silicon layer and the gate insulating film are terminated by oxygen. This structure is more stable in terms of energy than a structure having interface states.

Attention should be paid to the fact that oxidation at 600° C. or lower is performed on the Si substrate, the amorphous silicon channel, and the polysilicon channel in a stack structure already formed with the $SiO_2$ film and the Si layer. If oxidation is performed directly on the Si substrate, the amorphous silicon channel, and the polysilicon channel at 600° C., only a stack structure including the $SiO_2$ film and the Si layer with a high interface state density is formed. This is because the temperature is low, and the oxidation progresses without a correction to oxidation-induced strain. As a result, a large compression strain is applied to the interface between the $SiO_2$ film and the Si layer, and a large number of defects are generated at the interface. Therefore, defects existing at the interface in the stack structure formed with the $SiO_2$ film and the Si layer is selectively terminated by oxygen at a low temperature of 600° C.

In the above described experiment, the $SiO_2$ film was formed on the Si layer, and the interface between the $SiO_2$ film and the Si layer was terminated by oxygen from the side of the exposed $SiO_2$ film. However, the same effects as above can be achieved by terminating the interface between the $SiO_2$ film and the Si layer with oxygen from the side of the exposed Si layer. Here, attention should be paid to the fact that the above effects can be achieved, since the oxidation temperature is as low as 600° C. or even lower. At a high temperature, oxidation of the Si layer preferentially progresses, and it is difficult to terminate the interface between the $SiO_2$ film and the Si layer with oxygen from the side of the Si layer.

Further, in a case where the Si layer is a polycrystalline layer, the hydrogen atoms terminating the dangling bonds at the grain boundaries can be replaced with oxygen atoms by introducing oxygen from the side of the Si layer. This also contributes to an increase in mobility. This is because oxygen atoms have smaller charge transfers than those of hydrogen atoms, and generate fewer optical phonons.

The above described oxygen termination is performed at a low temperature of 600° C. or an even lower temperature. Therefore, there are restrictions on the upper limit of the processing temperature for some reasons, and the above described oxygen termination is effective particularly in a stack structure with a high interface state density. Such a stack structure can include a semiconductor layer and an insulating film formed by a deposition technique such as CVD, HTO, or ALD, or can include an insulating film formed by a deposition technique and a semiconductor layer formed by a deposition technique.

Although an example of the interface between a silicon oxide film and a Si layer has been described so far, the same effects as above can be of course expected from the interface between a silicon oxynitride film and a Si layer in a similar binding state. Further, those effects are attributable to the interface states existing at the interface between the insulating film and the semiconductor layer. Therefore, those effects can be achieved with the interface between some other oxide film and a semiconductor layer. The point is that the semiconductor layer is oxidized, and the defects existing at the interface are terminated by oxygen at a temperature lower than such temperatures at which a new oxide film is formed, and in a shorter time than such periods of time in which a new oxide layer is formed. For example, the insulating film can be a nitride film or an oxynitride film.

Next, an experiment was performed by further forming a high-k film (such as a HfSiO flim or a HfSiON film) having a higher dielectric constant than that of the $SiO_2$ film, on the $SiO_2$ film formed on the Si layer.

Figure 9:
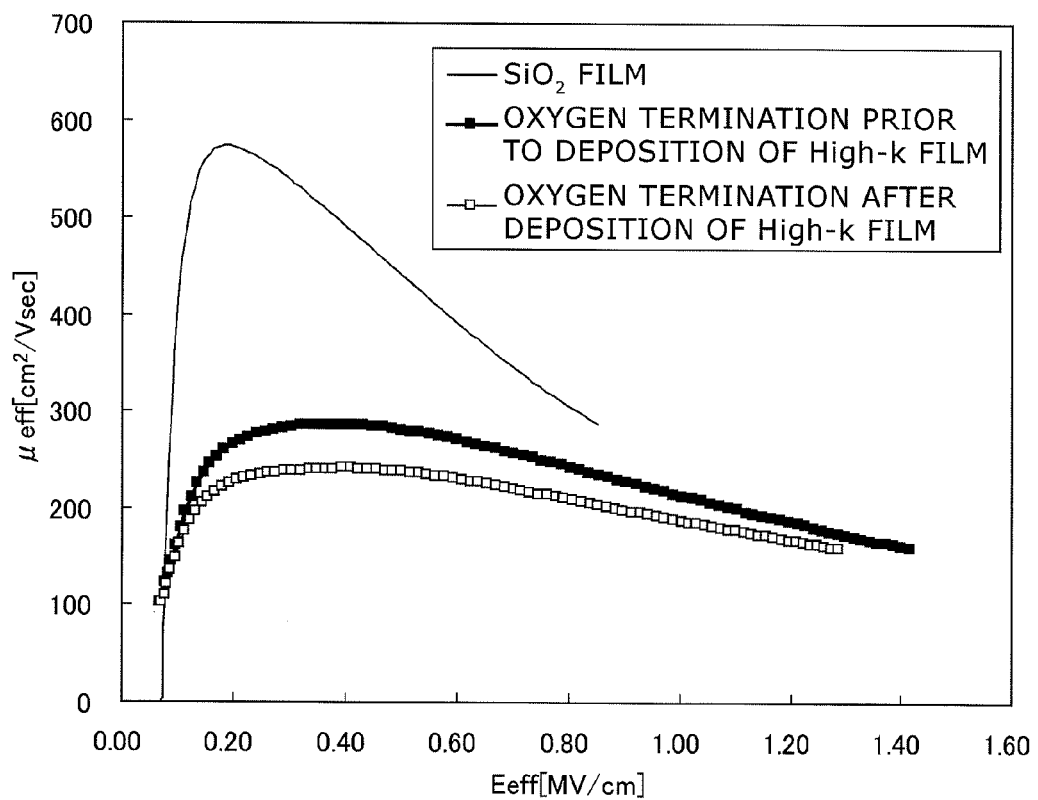
FIG. 9 is a graph showing the electric field dependence of the mobility.

The electric field dependence of the mobility was examined in a case where the interface states at the interface between the $SiO_2$ film and the Si layer were terminated by oxygen prior to deposition of a high-k film, and in a case where a high-k film was deposited without oxygen termination. The results of the experiment are shown in FIG. 9. The process performed after the deposition of a high-k film is the same in both cases. As can be seen from FIG. 9, decreases in the mobility were restrained by depositing a high-k film after the oxygen termination. This is because the interface states at the interface between the $SiO_2$ film and the Si layer were terminated by oxygen, the oxidation was stopped after one layer was completely oxidized, and an interface that was flat at the atomic level was realized between the $SiO_2$ film and the Si layer. The interface that is flat at the atomic level reduces instable binding states at the interface between the $SiO_2$ film and the Si layer, and the interstitial Si caused by such instable binding states. Such an interface also reduces the contact area between the $SiO_2$ film and the Si layer. In view of those facts, it is possible to restrain the following reaction caused at the interface between the $SiO_2$ film and the Si layer during the deposition of a high-k film, and SiO diffusion into the high-k film caused by the reaction:

$$SiO_2 + Si \rightarrow 2SiO$$

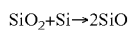

Accordingly, Si diffusion into the high-k film can be restrained. As a result, it is possible to restrain degradation of the thermal stability of the high-k film caused by Si diffusion, reduce the decreases in insulation properties due to local crystallization and grain boundary generation, restrain the generation of oxygen defects due to coexistence of Si and the high-k film, and reduce the decreases in mobility due to Fermi level pinning, remote Coulomb scattering, or the like caused by the above mentioned phenomena. As can be seen from those facts, it is critical to lower the interface state density at the interface between the $SiO_2$ film and the Si layer prior to the deposition of the high-k film.

Although a high-k film has been described as an example, the same effects as above can be expected with the use of some other material film. That is, in a case where a film made of a different material is formed in a stack structure having the interface between an oxide film and a semiconductor, oxygen is preferably introduced into the interface prior to the formation of the film made of the different material.

In the above described process, an $O_2$ gas is used to terminate the interface between the semiconductor layer and the insulating film with oxygen. However, oxygen atoms can be used as ozone or radicals.

Figure 10:
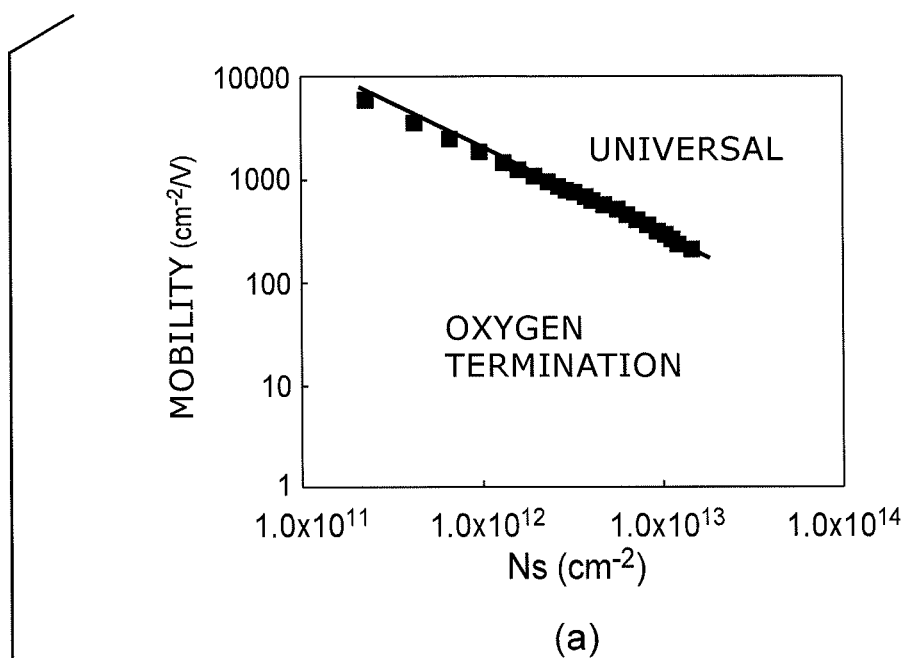
FIG. 10(a) is a graph showing the carrier density dependence of the mobility in a case where oxygen termination is performed.
FIG. 10(b) is a graph showing the carrier density dependence of the mobility in a case where hydrogen termination is performed.
Figure 10:
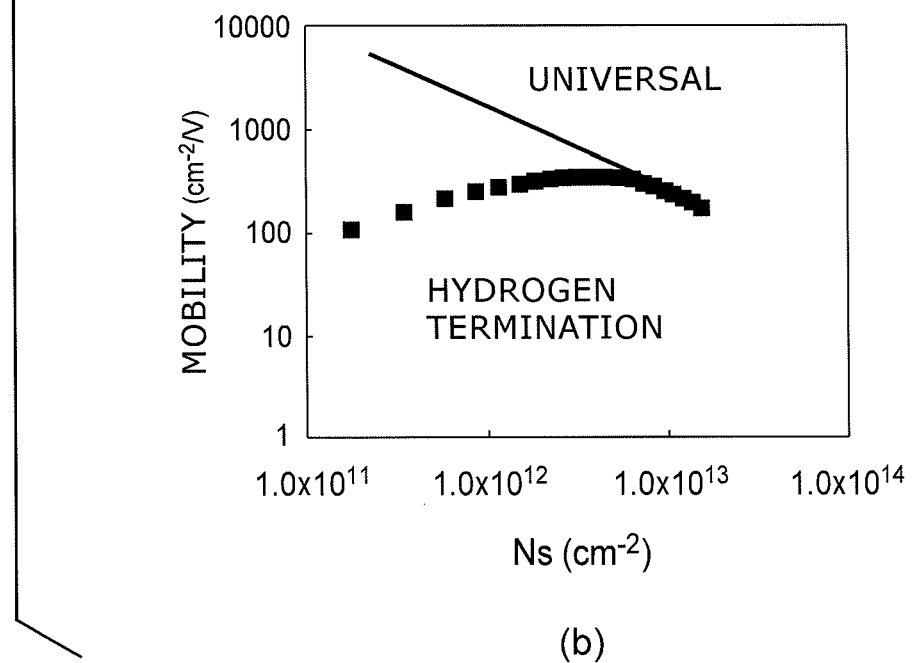

The difference in mobility between transistors due to the differences between the above described oxygen termination process and a conventional hydrogen termination process is now described. FIGS. 10(a) and 10(b) each show the dependence of the mobility on the carrier density Ns in a silicon layer. FIG. 10(a) concerns a transistor using the oxygen termination process. FIG. 10(b) concerns a transistor using a hydrogen termination process. As can be seen from FIG. 10(a), where oxygen termination is performed, the mobility linearly increases as the carrier density becomes lower, and this indicates almost the same behavior as the Si universal mobility. Where hydrogen termination is performed, the mobility also increases as the carrier density becomes lower. However, after the carrier density becomes lower than a certain value, the mobility starts becoming lower. This implies that the mobility is affected by optical phonon scattering due to Si—H bonds.

(First Embodiment)

Next, a method of manufacturing a semiconductor device according to a first embodiment is described. A semiconductor device manufactured by the manufacturing method according to this embodiment is a MONOS nonvolatile memory having a stack structure formed by stacking control gate electrodes made of doped polysilicon or the like and interlayer insulating films formed with silicon oxide films or the like. This nonvolatile memory includes memory cells. Referring to FIGS. 11 through 15, the method of manufacturing the nonvolatile memory according to this embodiment is described.

Figure 11:
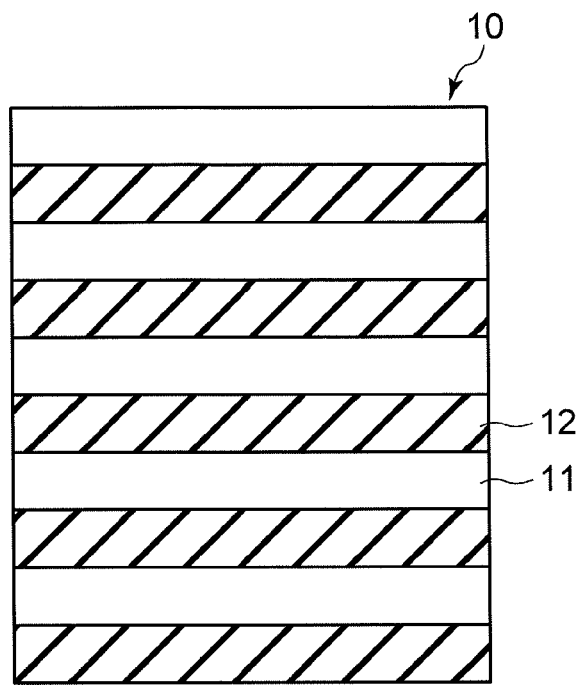
FIG. 11 is a cross-sectional view illustrating a manufacturing method according to a first embodiment.
Figure 12:
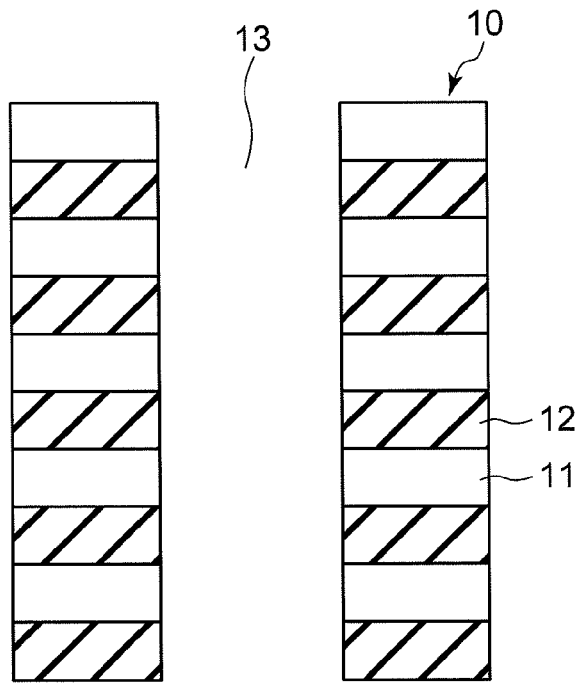
FIG. 12 is a cross-sectional view illustrating the manufacturing method according to the first embodiment.

First, a stack structure 10 is formed by stacking control gate electrodes 11 made of doped polysilicon or the like and interlayer insulating films 12 made of silicon oxide or the like (FIG. 11). Dry etching is then performed to form a through-hole 13 extending in the stacking direction at the center portion of the stack structure 10 (FIG. 12).

Figure 13:
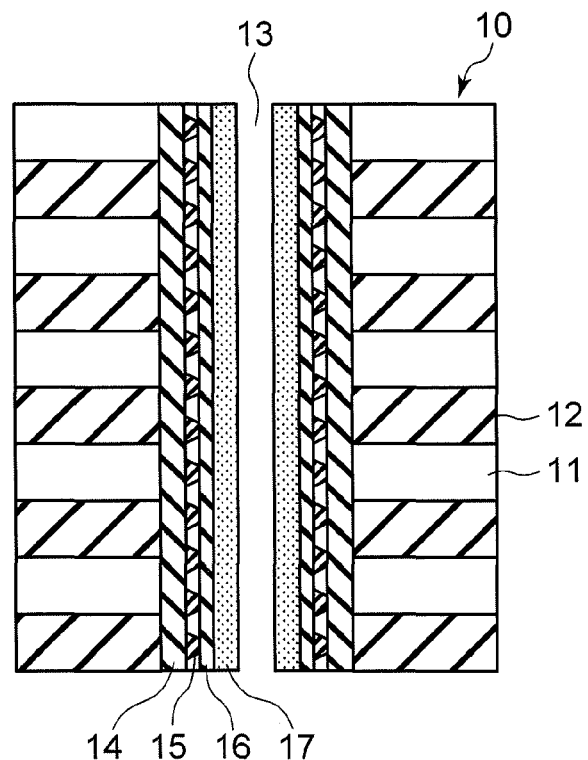
FIG. 13 is a cross-sectional view illustrating the manufacturing method according to the first embodiment.

A charge blocking insulating film 14 made of a high-dielectric constant material or silicon oxide is formed to cover the inner wall of the through-hole 13 of the stack structure 10. Further, a charge storage layer 15 that contains SiN and one of Hf, Zr, W, and Ti, and has convex portions in its inner face is discretely formed to cover the inner wall of the charge blocking insulating film 14 (FIG. 13). In FIG. 13, each convex portion of the charge storage layer 15 has a trapezoidal cross-sectional shape, but can have a circular cross-sectional shape. The charge storage layer 15 can be a multi-layer. Although the faces in contact with the charge blocking insulating film 14 exist in a discrete manner, those contact faces can exist in a continuous manner. A tunnel insulating film 16 made of silicon oxide film or the like is then formed to cover the charge storage layer 15, and a channel semiconductor layer 17 made of polycrystalline silicon is formed to cover the inner wall of the tunnel insulating film 16 (FIG. 13). As described above, the film stack consisting of the charge blocking insulating film 14, the charge storage layer 15, the tunnel insulating film 16, and the channel semiconductor layer 17 is formed in the through-hole 13 of the stack structure 10. Therefore, the diameter of the through-hole 13 becomes smaller than that observed prior to the formation of the film stack.

Figure 14:
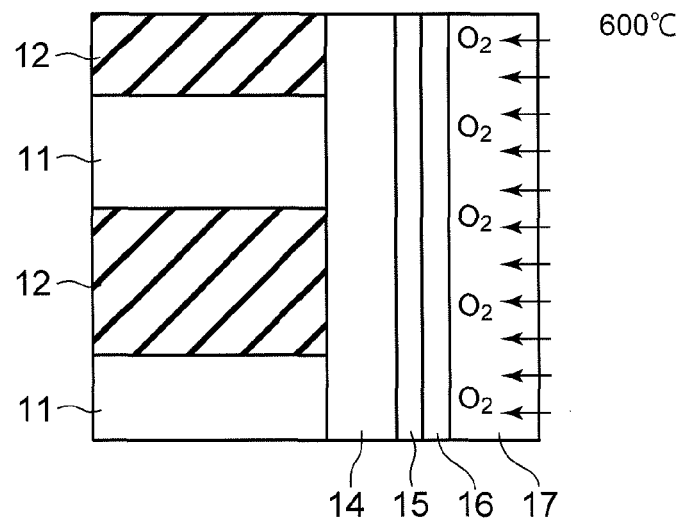
FIG. 14 is a cross-sectional view illustrating the manufacturing method according to the first embodiment.

As shown in FIG. 14, the temperature is maintained at 600° C. or lower, $O_2$ is introduced into the atmosphere, and a heat treatment is performed for 30 minutes or longer. Oxygen diffuses into the through-hole 13, and oxidizes the surface of the silicon layer to be the channel semiconductor layer 17. At the same time, oxygen reaches the interface between the tunnel insulating film 16 and the silicon layer 17, and oxidizes the interface states. The increase in the film thickness of the tunnel insulating film 16 due to the oxidation of the interface states is preferably 0.3 nm or smaller as described above, so as to restrain an increase in the interface state density.

Figure 15:
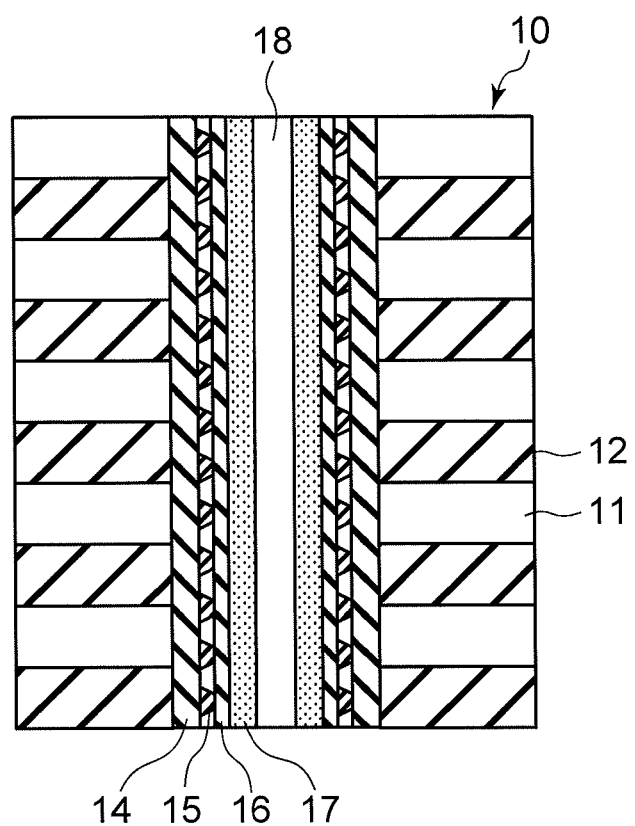
FIG. 15 is a cross-sectional view illustrating the manufacturing method according to the first embodiment.

As shown in FIG. 15, a SiN film 18 to be the core is then formed. After that, a select gate, peripheral circuits, and the like are formed, to complete the device.

As the charge blocking insulating film 14, a silicon oxide film can be formed from dichlorosilane and nitrous oxide at a high temperature of 600° C. to 800° C. by using LPCVD (Low Pressure Chemical Vapor Deposition). Alternatively, 3DMAS (Tris[dimethylamino]Silane), BTBAS (BIS[TertiaryButylAmino]Sialne), and ozone can be used as the raw materials, and a silicon oxide film can be formed at temperatures ranging from 400° C. to 600° C. by using ALD (Atomic Layer Deposition). In a case where an alumina film is formed as the charge blocking insulating film 14, trimethylaluminum and ozone (or water vapor) are used as the raw materials. In that case, MOCVD (Metal Organic Chemical Vapor Deposition) is performed at temperatures ranging from 500° C. to 800° C., and ALD is performed at temperatures ranging from 200° C. to 400° C.

The charge storage layer 15 is formed by forming a thin film of approximately 5 nm or thinner. The film formation can be performed by using ALD at 200° C. to 400° C., or MOCVD at 500° C. to 800° C. The film formation by ALD has the advantages that the film thickness controllability in thin film areas is excellent, and a film can be formed to cover the inner wall of the hole with an excellent coverage factor. As the Hf material, an organic source such as TEMAH (tetrakis (ethylmethylamido)hafnium), TDEAH (tetrakis(diethylamino)hafnium) or HTB (hafnium tetra-tert-butoxide) can be used. The same applies to other metals. Where the charge storage layer 15 is to be made of an oxide or a nitride, oxidation can be performed by supplying ozone or the like during the film formation, or annealing can be performed in an oxygen gas atmosphere, an ammonia gas atmosphere, or the like.

Figure 16:
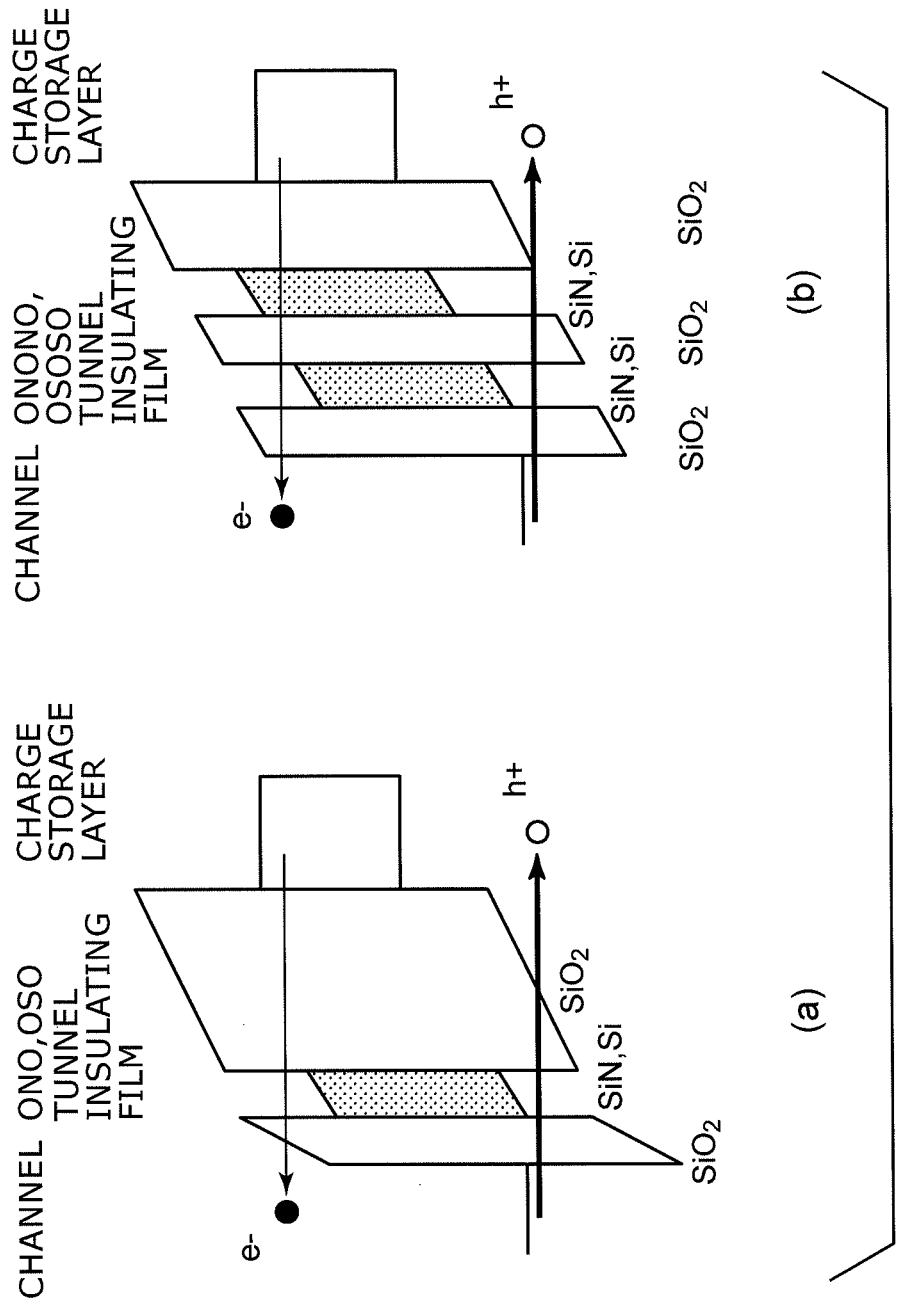
FIGS. 16(a) and 16(b) are diagrams for explaining erasing that is performed at higher speed in a nonvolatile memory manufactured according to the first embodiment.

Although the tunnel insulating film 16 has been described as a silicon oxide film, some other material can be used. In a case where a tunnel insulating film having an ONO (Oxide-Nitride-Oxide) structure is used, for example, a silicon nitride film is formed by using ALD, LPCVD, or plasma nitridation during the formation of the silicon oxide film. The film formation is performed by using dichlorosilane and ammonia at 300° C. to 500° C. by ALD, and at 600° C. to 800° C. by LPCVD. With the ONO structure, improvement of write and erase characteristics can be expected. Alternatively, it is possible to use an ONONO (Oxide-Nitride-Oxide-Nitride-Oxide) structure formed by further stacking two ONO structures, an OSO (Oxide-Silicon-Oxide) structure formed by inserting a Si dot layer, instead of a N layer, or an OSOSO (Oxide-Silicon-Oxide-Silicon-Oxide) structure. With an ONONO structure, an OSO structure, or an OSOSO structure, greater improvement of write and erase characteristics than the improvement that can be achieved with an ONO structure can be expected. This is because a band structure that assists electron emission from the storage layer is formed on the charge storage layer side, as shown in FIGS. 16(a) and 16(b). Therefore, erasing is performed through electron emission as well as hole injection. Accordingly, erasing can be performed at higher speed.

The channel semiconductor layer 17 is formed by depositing an amorphous silicon of 20 nm in film thickness, and annealing is performed at a high temperature of 700° C. or higher, to crystallize the amorphous silicon. Annealing is performed at such a temperature that amorphous silicon is crystallized. Therefore, grain boundaries exist in the channel semiconductor layer 17. To oxidize the interface between the tunnel insulating film 16 and the channel semiconductor layer, and lower the interface state density, the layer thickness of the channel semiconductor layer 17 is preferably 20 nm or smaller. The layer thickness of the channel semiconductor layer 17 is preferably 6 nm or larger. If the layer thickness of the channel semiconductor layer 17 is smaller than 6 nm, a narrow-width effect is caused in the semiconductor layer 17 and a resistance value of the semiconductor layer 17 rises.

Figure 17:
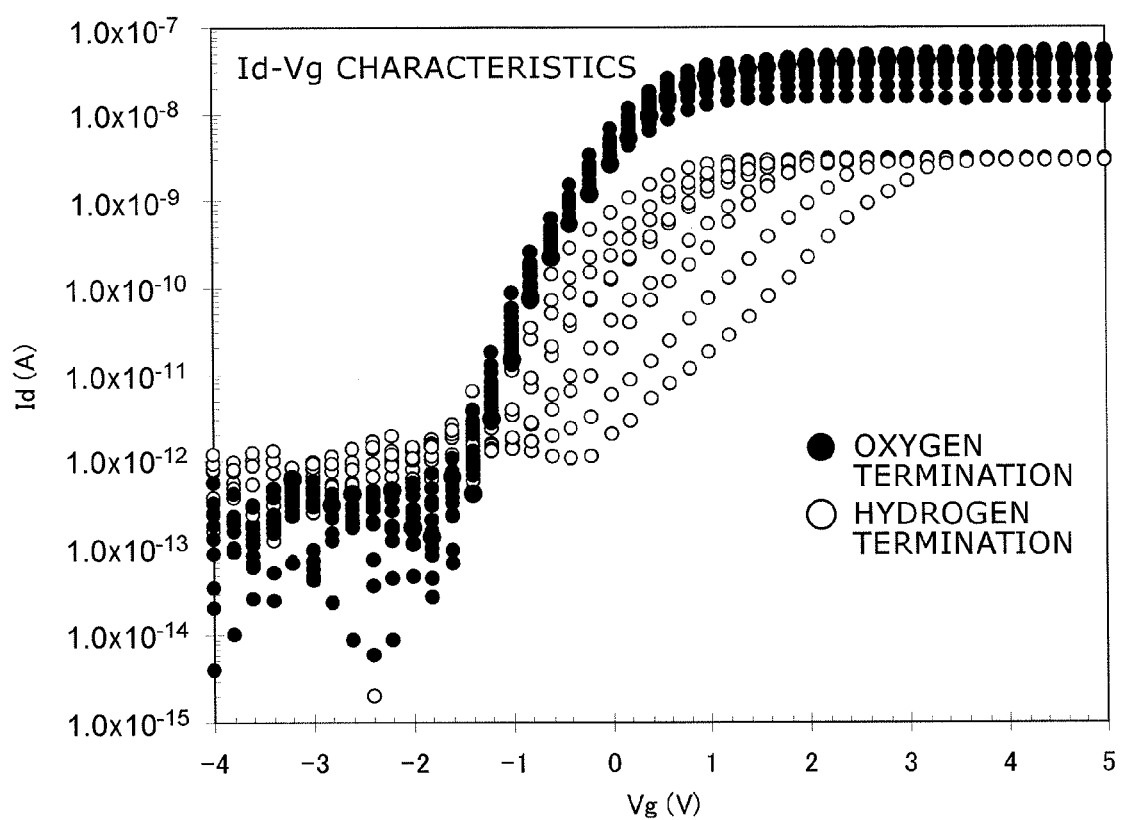
FIG. 17 is a graph showing the Id-Vg characteristics of the nonvolatile memory manufactured according to the first embodiment.
Figure 18:
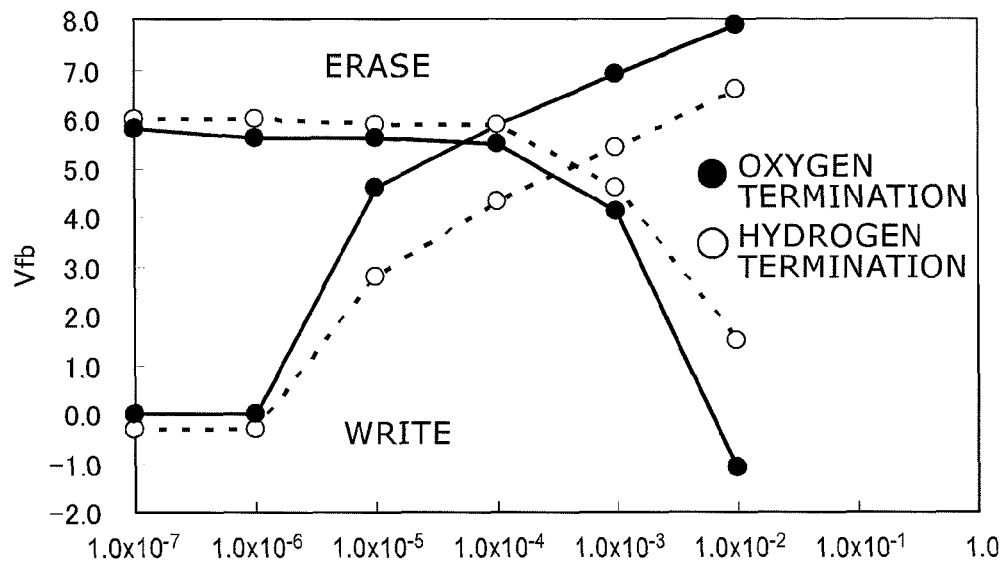
FIG. 18 is a graph showing the write and erase characteristics obtained in a case where oxygen termination is performed, and the write and erase characteristics obtained in a case where hydrogen termination is performed.
Figure 19:
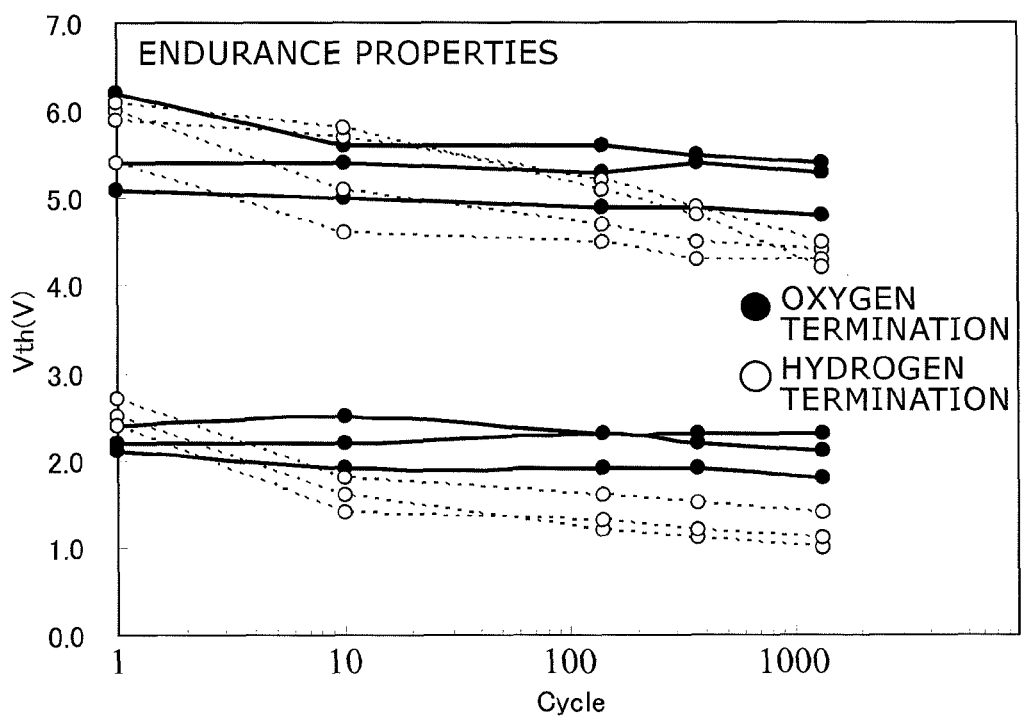
FIG. 19 is a graph showing the endurance properties obtained in the case where oxygen termination is performed and in the case where hydrogen termination is performed.
Figure 20:
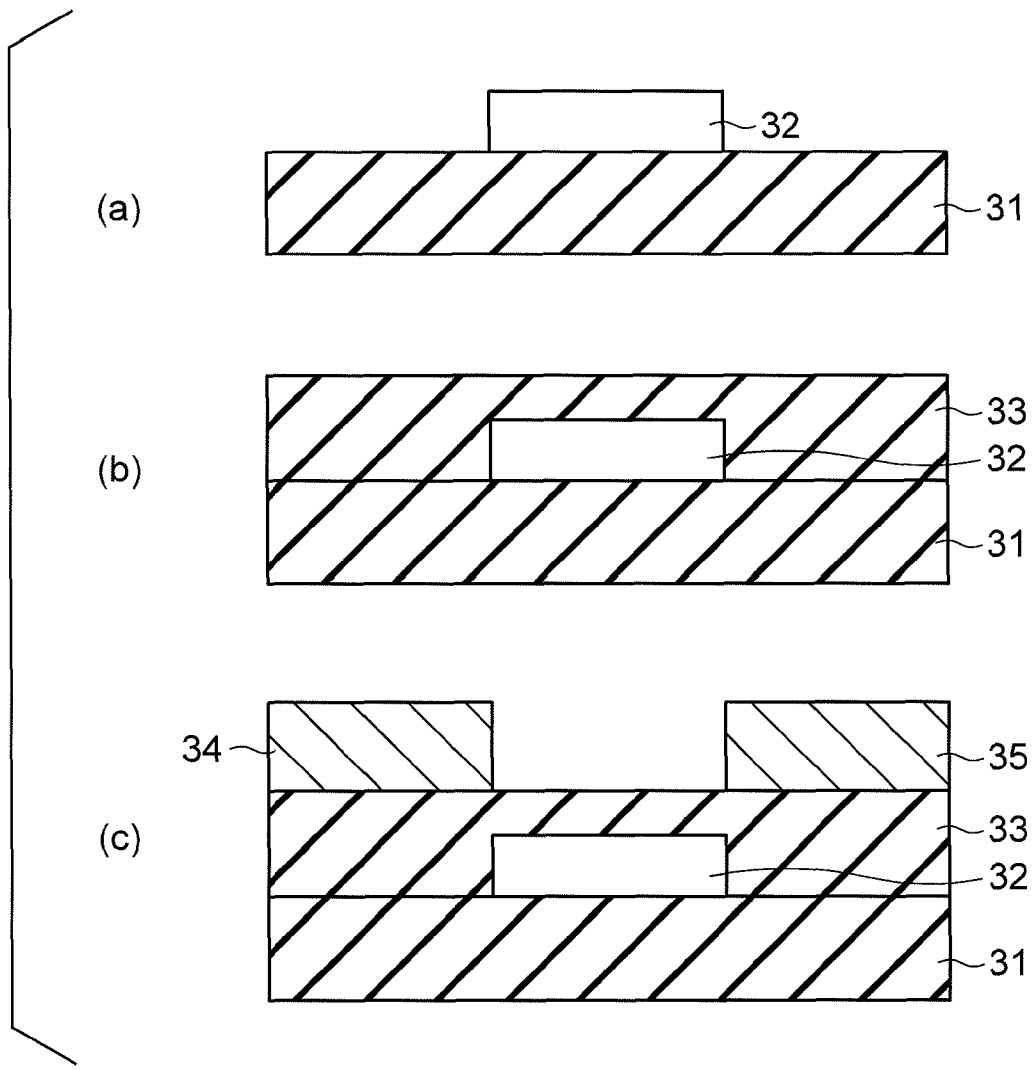
FIGS. 20(a) through 20(c) are cross-sectional views illustrating a manufacturing method according to a second embodiment.
Figure 21:
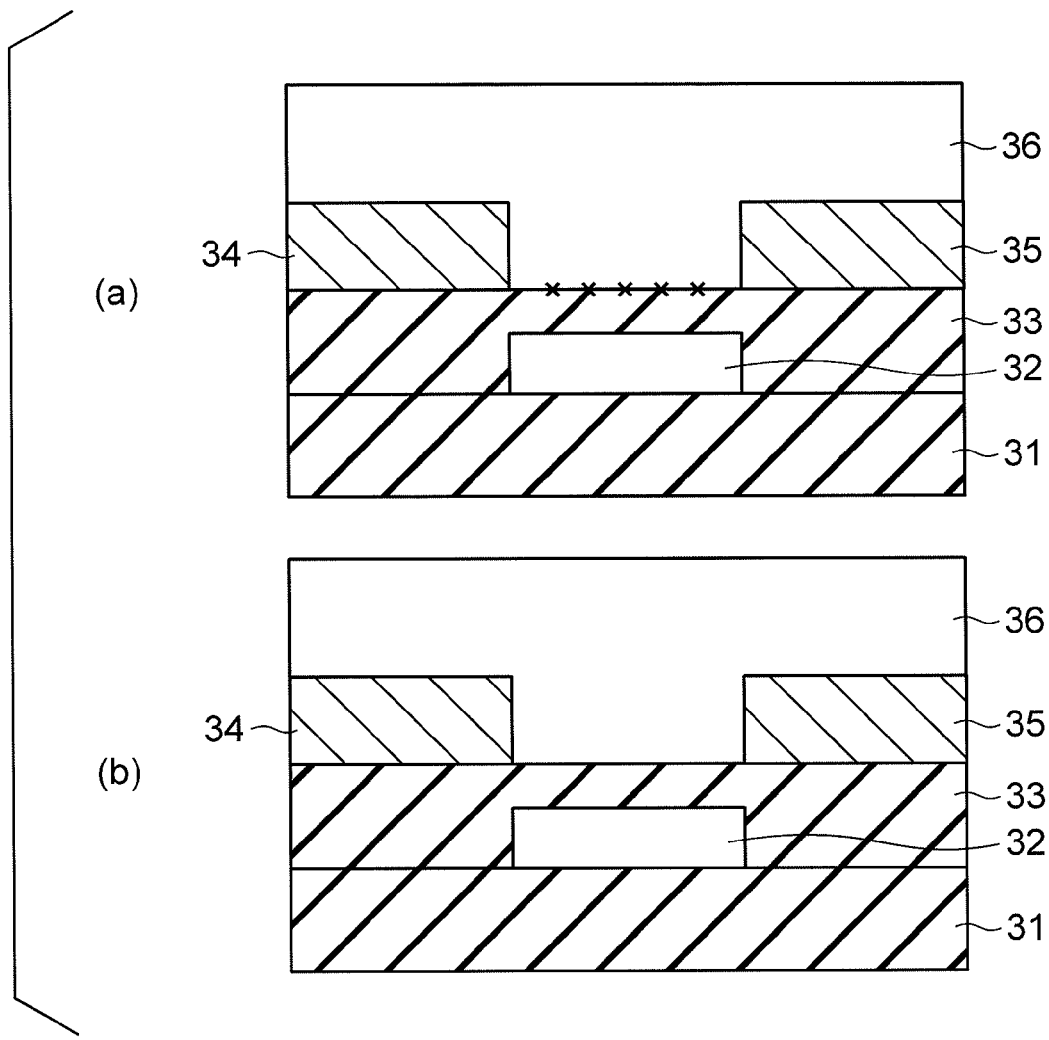
FIGS. 21(a) and 21(b) are cross-sectional views illustrating the manufacturing method according to the second embodiment.

Referring now to FIGS. 17 through 19, the characteristics of the nonvolatile memory manufactured according to this embodiment and the characteristics of a nonvolatile memory of a comparative example are described. While the nonvolatile memory of this embodiment has a three-dimensional MONOS structure in which the interface states between the silicon layer and the tunnel insulating film are terminated by oxygen, the nonvolatile memory of the comparative example has a hydrogen-terminated three-dimensional MONOS structure. While the temperature for the oxygen termination was 600° C., the temperature for the hydrogen termination was 450° C.

In this embodiment having the interface states terminated by oxygen, the Id-Vg characteristics indicating the relationship between the drain current Id and the gate voltage Vg have a much greater improvement than that in the comparative example (FIG. 17), and the write and erase characteristics are much better than those in the comparative example (FIG. 18). Also, as shown in FIG. 19, the endurance properties are improved, and the service life is made longer.

This is because the interface states at the interface between the $SiO_2$ film (the tunnel insulating film 16) and the Si layer 17 are terminated by oxygen, and a flat interface is realized between the $SiO_2$ film and the Si layer by limiting oxidation to one layer. In this manner, unstable bonding states at the interface between the $SiO_2$ film and the Si layer, and the interstitial Si generated by the unstable bonding states are reduced, and the contact area between the $SiO_2$ film and the Si layer is made smaller.

Also, since the temperature is as low as 600° C. or even lower, only a few atomic layers of the surface of the channel Si layer are oxidized, and the influence on the thickness of the channel layer is extremely small. Accordingly, the drain current Id is not reduced. Instead, the drain current Id is effectively increased by the decrease in the interface states. Thus, the mobility becomes much higher.

Also, as the channel mobility becomes higher, the electrons at the time of writing and the holes at the time of erasing increase. Accordingly, the write and erase characteristics are improved.

Also, by forming strong Si—O bonds at the interface, the following reaction that is to occur at the interface between the $SiO_2$ film and the Si layer during the later deposition of the core SiN film 18 can be restrained:

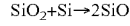

$$SiO_2 + Si \rightarrow 2SiO$$

Accordingly, Si diffusion into the tunnel insulating film can be restrained, and decreases of the reliability due to occurrences of defects caused by the Si diffusion in the tunnel insulating film can also be restrained.

As described above, oxygen termination minimizes oxidation of Si—Si bonds, and the stack structure of the $SiO_2$ film and the Si layer is subjected to a heat treatment under such weakly oxidizing conditions that only Si dangling bonds and Si—H bonds can be selectively oxidized. Particularly, in the BiCS structure of this embodiment, the interface between the $SiO_2$ film 16 and the Si layer 17 is terminated by oxygen through the channel Si layer 17. As the Si dangling bonds and the Si—H bonds are turned into Si—O bonds, the mobility and the reliability are increased.

Furthermore, Si dangling bonds are not formed by hydrogen detachment from Si—H bonds that occurs in the high-temperature hydrogen atmosphere during the process to form the core SiN layer 18 by a conventional manufacturing method that does not involve oxygen termination. Therefore, fluctuations of the threshold voltage in the later processes can be restrained. That is, the mobility and reliability of the carrier conducting layer such as a deposited Si layer formed on the tunnel insulating film can be increased, which contribute to a lower voltage and a longer service life of the device.

When the interface between the insulating film and the Si layer is oxidized through the Si layer, a $SiO_2$ layer is formed on the surface of the Si layer. The $SiO_2$ layer has the effect to delay $O_2$ diffusion. That is, the film increase at the interface between the $SiO_2$ film and the Si layer characteristically becomes smaller, as the sintering time becomes longer. This reduces the oxidation of the interface between the $SiO_2$ film and the Si layer per processing time. Accordingly, film thickness variations due to oxidation can be restrained, and the margin of the improvement process with respect to time can be widened. Furthermore, carriers travel through the interface between the $SiO_2$ film and the Si layer, and the amount of oxidation in the surface of the Si layer at 600° C. is as small as approximately 1 nm. Therefore, a decrease in the Si film thickness due to the oxidation of the surface side of the Si layer does not hinder the flow of carriers.

In this embodiment, the oxidation time at 600° C. for oxygen termination is 30 minutes or longer. However, the oxidation time can be shorter than that, as long as the interface is terminated by oxygen. Also, if allowable in the process, oxidation can be performed for two hours or longer. However, a long processing time lowers the throughput of products and therefore, is not preferable. Also, the temperature can be lower than 600° C., as long as the interface is oxidized. However, the oxygen diffusion rate in Si becomes remarkably lower with a drop in temperature, and therefore, the processing time becomes longer. If the processing time is to be two hours or shorter, the temperature should be 500° C. or higher.

As described above, according to this embodiment, decreases in mobility and reliability due to an increase in the interface state density between the semiconductor layer and the insulating film can be restrained.

Also, a nonvolatile memory manufactured by the manufacturing method according to this embodiment not only can realize a larger memory window for further writing, erasing, and the like, but also can realize a longer service life. Accordingly, the problem of degradation of interfacial characteristics, which has been the drawback of three-dimensional structures, can be solved.

(Second Embodiment)

Next, a method of manufacturing a semiconductor device according to a second embodiment is described. A semiconductor device manufactured by the manufacturing method according to this embodiment includes a thin film transistor (TFT). The TFT includes a gate electrode that is formed on an insulating film substrate such as a $SiO_2$ substrate and is made of polysilicon or a metal, a gate insulating film formed with a $SiO_2$ film or the like, a source terminal and a drain terminal made of polysilicon or a metal, and a channel semiconductor layer made of polysilicon or amorphous silicon. Referring now to FIGS. 20(a) through 21(b), the method of manufacturing the TFT according to this embodiment is described.

First, a Si substrate (not shown) having a $SiO_2$ film 31 formed on its surface is subjected to a SH treatment, to remove the impurities absorbed to the surface of the $SiO_2$ film 31. Amorphous silicon is then formed on the $SiO_2$ film 31 by plasma CVD using silane ($SiH_4$) as a raw material gas. After the hydrogen in the amorphous silicon is removed by a heat treatment performed at 400° C. to 450° C., the amorphous silicon is crystallized by XeCl excimer laser annealing, for example, and is turned into polycrystalline silicon. P (phosphorus) is then implanted by a dose amount of $4 \times 10^{15}$ cm$^{-2}$ at an acceleration voltage of 4 kev, and 1-hour annealing is performed at 450° C. to 600° C., to activate the phosphorus in the polysilicon. After that, patterning is performed on the polysilicon into a gate electrode shape, so that a polysilicon gate electrode 32 is formed on the SiO$_2$ film 31 (FIG. 20(a)).

A gate insulating film 33 made of SiO$_2$ is formed by using, for example, ALD at 500° C., so as to cover the gate electrode 32, as shown in FIG. 20(b). A metal film such as an Al film is formed on the gate insulating film 33, and patterning is performed on the Al film, to form a source terminal 34 and a drain terminal 35 immediately above the portions of the gate insulating film 33 located on both sides of the gate electrode 32 (FIG. 20(c)).

An amorphous silicon layer is then deposited on the entire surface by using SiH$_4$. After that, an excimer laser is emitted to locally heat and melt the amorphous silicon layer on the substrate, and the amorphous silicon layer is crystallized. In this manner, a polycrystalline silicon layer 36 to be the channel semiconductor layer is formed (FIG. 21(a)). At this point, interface states (indicated by Xs) are formed at the interface between the polycrystalline silicon layer 36 and the gate insulating film 33.

The substrate temperature is then set at 600° C. or lower and is maintained at that temperature for 30 minutes or longer in an oxidizing atmosphere containing O$_2$ at 10 Torr in partial pressure. With this arrangement, the oxygen atoms introduced through the surface of the polycrystalline silicon layer 36 diffuse to the vicinity of the interface between the polycrystalline silicon layer 36 and the gate insulating film 33, and the interface is terminated by oxygen (FIG. 21(b)).

To oxidize the interface between the gate insulating film 33 and the channel semiconductor layer 36 and lower the interface state density as in the first embodiment, the layer thickness of the channel semiconductor layer 36 is preferably 20 nm or smaller. The layer thickness of the channel semiconductor layer 36 is preferably 6 nm or larger. If the layer thickness of the channel semiconductor layer 36 is smaller than 6 nm, a narrow-width effect is caused in the semiconductor layer 36 and a resistance value of the semiconductor layer 36 rises. Also, the increase in the film thickness of the gate insulating film 33 due to the process to terminate the interface with oxygen is preferably 0.3 nm or smaller, as described above, to restrain increases in the interface state density.

To reduce the interface states and increase the mobility, a 1000° C. heat treatment needs to be performed according to conventional methods. To allow such a heat treatment, an expensive quartz substrate having a heat resistance to high temperatures of 1000° C. or higher has been used. However, an increase in mobility can be realized by using the oxygen termination technique according to this embodiment, as described with reference to FIGS. 16(a) and 16(b). Accordingly, improvement of characteristics can be achieved with an inexpensive glass substrate having no heat resistance (600° C. or lower), and as a result, the unit device cost can be greatly lowered.

Also, in this embodiment, oxygen termination is performed through the polycrystalline silicon layer 36. Accordingly, an oxide film (a surface oxide film) of approximately 1 nm to 2 nm in thickness is formed on the surface of the channel semiconductor layer 36. This film has the effect to restrain a NH$_3$ gas from entering the channel at the time of formation of a protection film (such as a SiN film) to be deposited later. If hydrogen radicals enter the channel, the carrier scattering is reduced, and the mobility becomes lower. However, the decrease in mobility can be restrained by the secondary effect (surface oxidation) at the time of the oxygen termination. Further, the surface oxide film has the effect to reduce the oxygen diffusion rate. That is, the surface oxide film has the effect to spontaneously restrain oxidation of the interface between the gate insulating film and the semiconductor layer. Accordingly, the time margin with respect to the amount of interface oxidation becomes wider, and the decrease in mobility due to peroxidation can be restrained.

As described above, according to this embodiment, decreases in mobility and reliability due to increases in the interface state density between the semiconductor layer and the insulating film can be restrained.

As described so far, according to each of the embodiments, oxygen is introduced into the interface between a silicon substrate and a gate insulating film at 600° C. or lower, and the oxygen can be diffused at the interface and be fixed in the interface states. Therefore, the interface states in the bandgap are reduced, and variations of the transistor threshold value due to the interface states can be restrained. Also, optical phonon generation due to carrier scattering is reduced. Accordingly, an insulating film having a stable interfacial structure is formed, and a highly-reliable semiconductor device that does not involve a decrease in current drive capability of the device can be manufactured.

While certain embodiments have been described, these embodiments have been presented by way of example only, and are not intended to limit the scope of the inventions. Indeed, the novel methods and systems described herein can be embodied in a variety of other forms; furthermore, various omissions, substitutions and changes in the form of the methods and systems described herein can be made without departing from the spirit of the inventions. The accompanying claims and their equivalents are intended to cover such forms or modifications as would fall within the scope and spirit of the inventions.

What is claimed is:

1. A method of manufacturing a semiconductor device, comprising:
    forming a stack structure by alternately stacking control gate electrodes and interlayer insulating films;
    forming a through-hole that penetrates through the stack structure in a stacking direction of the control gate electrodes and the interlayer insulating films;
    forming a first insulating film that covers an inner surface of the through-hole;
    forming a charge storage layer that covers an inner surface of the first insulating film;
    forming a second insulating film that covers an inner surface of the charge storage layer;
    forming a semiconductor layer that covers an inner surface of the second insulating film; and
    exposing a surface of the semiconductor layer opposite from the inner surface of the second insulating film in an atmosphere containing O$_2$ gas at a temperature of 600° C. or lower to oxidize the surface of the semiconductor layer and an interface between the semiconductor layer and the second insulating film.

2. The method according to claim 1, wherein the semiconductor layer contains a grain boundary.

3. The method according to claim 1, wherein the semiconductor layer has a layer thickness of 20 nm or smaller.

4. The method according to claim 1, wherein the oxidizing is performed so that an increase in a film thickness of the second insulating film becomes 0.3 nm or smaller.

5. The method according to claim 1, wherein the charge storage layer is a multi-layer.

6. The method according to claim 1, wherein the semiconductor layer has a layer thickness of 6 nm or larger.

7. A method of manufacturing a semiconductor device, comprising:
- depositing an insulating film on a substrate;
- forming a semiconductor layer on the insulating film; and
- oxidizing an interface between the semiconductor layer and the insulating film by performing a heat treatment in an atmosphere containing $O_2$ gas at a temperature of 600° C. or lower.

8. The method according to claim 7, wherein the semiconductor layer contains a grain boundary.

9. The method according to claim 7, wherein the semiconductor layer has a layer thickness of 20 nm or smaller.

10. The method according to claim 7, wherein the oxidizing is performed so that an increase in a film thickness of the insulating film due to the oxidizing becomes 0.3 nm or smaller.

11. The method according to claim 7, wherein the semiconductor layer has a layer thickness of 6 nm or larger.

\* \* \* \* \*